(12) United States Patent
Xu et al.

(10) Patent No.: US 7,834,796 B2
(45) Date of Patent: Nov. 16, 2010

(54) ANALOG-TO-DIGITAL CONVERTER

(75) Inventors: Yong Ping Xu, Singapore (SG); Honglei Wu, Singapore (SG)

(73) Assignee: National University of Singapore, Singapore (SG)

( * ) Notice: Subject to any disclaimer, the term of this patent is extended or adjusted under 35 U.S.C. 154(b) by 0 days.

(21) Appl. No.: 12/162,777

(22) PCT Filed: Feb. 2, 2007

(86) PCT No.: PCT/SG2007/000034

§ 371 (c)(1),
(2), (4) Date: Oct. 14, 2008

(87) PCT Pub. No.: WO2007/089211

PCT Pub. Date: Aug. 9, 2007

(65) Prior Publication Data

US 2009/0167587 A1      Jul. 2, 2009

Related U.S. Application Data

(60) Provisional application No. 60/764,803, filed on Feb. 2, 2006.

(51) Int. Cl.
   *H03M 1/12*      (2006.01)
(52) U.S. Cl. .................. 341/172; 341/155; 341/163
(58) Field of Classification Search .............. 341/172
   See application file for complete search history.

(56) References Cited

U.S. PATENT DOCUMENTS

| 4,385,286 | A | * | 5/1983 | Haque | ........................ 341/108 |
|---|---|---|---|---|---|
| 4,851,846 | A | * | 7/1989 | Haulin | ........................ 341/172 |
| 5,600,322 | A | | 2/1997 | Garavan | |
| 6,118,400 | A | | 9/2000 | Susak | |
| 6,720,903 | B2 | | 4/2004 | Confalonieri et al. | |
| 6,828,927 | B1 | | 12/2004 | Hurrell et al. | |
| 6,864,821 | B2 | | 3/2005 | Yang | |
| 6,894,627 | B2 | * | 5/2005 | Janakiraman et al. | ....... 341/102 |
| 7,158,069 | B2 | * | 1/2007 | Confalonieri et al. | ....... 341/155 |
| 2005/0231412 | A1 | | 10/2005 | Confalonieri et al. | |
| 2006/0247550 | A1 | * | 11/2006 | Thiagarajan et al. | ........ 600/528 |

OTHER PUBLICATIONS

Application Note 1080—"Understanding SAR ADC's", Dallas Semiconductor, MAXIM, Mar. 1, 2001, 6 pages.
Hsu et al., "A 10-Bit 40MS/s Successive Approximation Register A/D Converter", downloaded from the Internet on Mar. 10, 2007, 5 pages.
Scott et al., "An Ultralow Energy ADC for Smart Dust", IEEE Journal of Solid State Circuits, vol. 38, No. 7, Jul. 2003, pp. 1123-1129.

(Continued)

*Primary Examiner*—Khai M Nguyen
(74) *Attorney, Agent, or Firm*—Schwabe, Williamson & Wyatt, P.C.

(57) ABSTRACT

An analog-to-digital converter (ADC) and a battery operated electronic device comprising the ADC. The ADC comprising an input switch; an array of binary-weighted capacitors, the array of capacitors receiving the input voltage signal via the input switch in an on state of the input switch; a plurality of switches, each switch connected in series with a respective one of the capacitors at an opposite side compared to the input switch, wherein a VDD signal is applied to each switch in one switching state and ground in another switching state; a comparator having as one input a voltage from the input switch side of the array of capacitors and as another input a voltage of VDD/2; and a switch control unit coupled to an output of the comparator for controlling the switches based on the output from the comparator.

32 Claims, 6 Drawing Sheets

OTHER PUBLICATIONS

Hester et al., "Fully Differential ADC With Rail to Rail Common Mode Range And Nonlinear Capacitor Compensation", IEEE Journal of Solid State Circuits, vol. 25, No. 1, Feb. 1990, pp. 173-183.
ISSCC 2004 / Session 17 / Mems and Sensors / 17.5 "A Very Low Power CMOS Mixed-Signal IC for Implantable Pacemaker Applications", 10 pages.
ESSCIRC 2002 "A 0.5V, 1μW Successive Approximation ADC" Jens Sauerbrey, Doris Schmitt-Landsiedel, Roland Thewes, pp. 247-250.
IEEE 2005 "A 1V Supply Successive Approximation ADC With Rail-To-Rail Input Voltage Range" Takeshi Yoshida, Miho Akagi, Mamoru Sasaki and Atsushi Iwata, pp. 192-195.

* cited by examiner

ANALOG-TO-DIGITAL CONVERTER

RELATED APPLICATION

This application claims the benefit of PCI Application PCT/SG2007/000034 filed Feb. 2, 2007, which in turn claims the benefit of U.S. Provisional Application No. 60/764,803 filed Feb. 2, 2006.

FIELD OF INVENTION

The present invention relates broadly to an analog-to-digital converter (ADC) and a battery operated electronic device comprising the ADC.

BACKGROUND

Battery operated devices are widely used. For example, many patients can benefit from wearable medical devices that provide real-time monitoring and possibly on-site treatment. It is desirable for such devices to operate under a single micro battery that is lightweight and low-volume. Therefore, such devices require operating at a low supply voltage (e.g. 1-1.5V) with ultra low power consumption for long battery lifetime. In addition, the devices also need to exhibit low input referred noise in order to pick up very weak biomedical signals. It is also desirable for such devices to have rail-rail input range. As such, a low voltage low power biomedical signal acquisition integrated circuit (IC) is required.

The analog-to-digital converter (ADC) serves as the interface between real world parameters and digital circuits and is an important component in a mixed-signal IC. It is important that the ADC is of low voltage and low power. Successive approximation ADC based on charge redistribution has been widely used in low power applications. Its operation principle is the same binary-search algorithm used in all successive approximation ADCs.

FIG. 1 shows a conventional successive approximation ADC 100 based on charge redistribution. The binary-weighted capacitor array 102 of the ADC 100 acts as both a digital-to-analog converter (DAC) and a sample capacitor. The conventional ADC 100 relies heavily on analog CMOS switches, which should pass analog signals of all levels to the capacitor array 102. However, at low supply voltages, i.e. $V_{DD} < V_{thn} + V_{thp}$, the CMOS switches will exhibit very high impedance for signals near half of $V_{DD}$. Thus, the conventional ADC 100 is not suitable for low-voltage operation. Several modifications have been proposed to reduce the supply voltage.

For example, a structure of an ADC 200 where the input is directly fed to a comparator 202, as shown in FIG. 2, has been proposed. The switches that control the capacitor array are only required to pass supply-rail-level signals since they are no longer connected to the input signal. However, noting the existence of a sample-and-hold (S/H) circuit 204 at the input of the comparator 202, potential problems may still exist for the switches. The remedy here is to scale the DAC output to only half of $V_{DD}$ or lower to allow the correct operation of the S/H circuit 204. Although this structure 200 can work under low supply voltage (i.e. $V_{DD} < V_{thn} + V_{thp}$), its input range is limited to the common-mode input range or half of $V_{DD}$, whichever is the lower. Thus, it cannot handle rail-rail input signal.

Further, a structure that does not require the comparator to have a wide common-mode input range has also been proposed. However, it needs an extra capacitor in addition to the capacitor array, which increases costs.

FIG. 3 shows a structure of an ADC 300 where rail-rail input range is achieved by scaling down the input signal prior to conversion. The signal scaling is performed by using an extra capacitor, which increases cost.

A S/H circuit usually precedes an ADC and consumes a non-negligible amount of power and chip area. Although it is possible to combine the S/H circuit and the comparator to save chip area, additional power consumption is still needed to provide the S/H function.

Therefore, there is a need to provide an ADC for low voltage and low power operation with rail-rail input range to address at least one of the above-mentioned problems.

SUMMARY

In accordance with a first aspect of the present invention, there is provided an analog-to-digital converter (ADC) comprising an input switch; an array of binary-weighted capacitors, the array of capacitors receiving the input voltage signal via the input switch in an on state of the input switch; a plurality of switches, each switch connected in series with a respective one of the capacitors at an opposite side compared to the input switch, wherein a $V_{DD}$ signal is applied to each switch in one switching state and ground in another switching state; a comparator having as one input a voltage from the input switch side of the array of capacitors and as another input a voltage of $V_{DD}/2$; and a successive approximation register (SAR) coupled to an output of the comparator for controlling the switches based on the output from the comparator.

The input switch may be in an on state prior to analog-to-digital conversion to provide the input voltage to the array of binary-weighted capacitors and may be in an off state during the analog-to-digital conversion.

At the beginning of the analog-to-digital conversion, the switch connected to a Most Significant Bit (MSB) one of the capacitors may be switched to the $V_{DD}$ signal and all other switches may be switched to ground.

The switch connected to the MSB capacitor may be switched to ground for subtracting about $V_{DD}/2$ from the input voltage if the comparator determines that the voltage from the input switch side of the array of capacitors is greater than $V_{DD}/2$ or to $V_{DD}$ if the voltage from the input switch side of the array of capacitors is lower than or equal to $V_{DD}/2$.

When the MSB capacitor is switched to ground for subtracting about $V_{DD}/2$ from the input voltage, the voltage at the input switch side of the array of capacitors may be reduced to within a range of about 0 to about $V_{DD}/2$.

In a register sequence, the switch connected to a next lower bit capacitor may then be switched to the $V_{DD}$ signal and said next switch may be switched to ground if the comparator determines that the voltage from the input switch side of the array of capacitors is greater than $V_{DD}/2$ or to $V_{DD}$ if the voltage from the input switch side of the array of capacitors is lower than or equal to $V_{DD}/2$.

The register sequence may be sequentially applied to all switches.

After the switch connected to a Least Significant Bit (LSB) capacitor has been subjected to the register sequence, the input switch may be closed to provide a new input signal to the array of capacitors.

The input switch may be implemented as a sampling switch.

The sampling switch may comprise an n- and p-transistor pair.

The input switch may be implemented in an output stage of a Low Noise Operational Transconductance Amplifier (LN-OTA) coupled to the ADC.

The input switch may be implemented by a pair of switch elements in the output stage of the LN-OTA coupled to the ADC.

In accordance with a second aspect of the present invention, there is provided a battery operated electronic device comprising an ADC as described above.

The device may be a medical device for electroencephalograms (EEG) and electrocardiograms (ECG).

BRIEF DESCRIPTION OF THE DRAWINGS

Embodiments of the invention will be better understood and readily apparent to one of ordinary skill in the art from the following written description, by way of example only, and in conjunction with the drawings, in which.

DETAILED DESCRIPTION

The embodiments described herein provide an ADC suitable for A/D conversion in low-voltage and low-power, such as remote sensor networks and micro medical devices. The embodiments provide a low voltage analog-to-digital (A/D) conversion without using an extra capacitor in addition to a binary capacitor array of an ADC.

Figure 1:
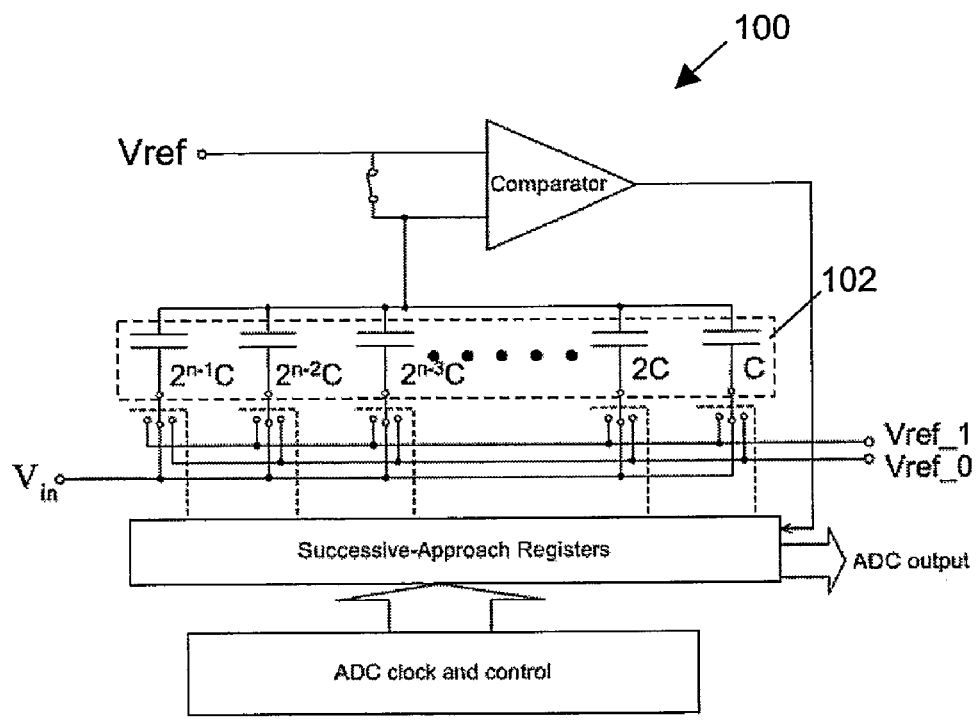
FIG. 1 shows a schematic drawing of a conventional successive approximation analog-to-digital converter (ADC) based on charge redistribution.
Figure 2:
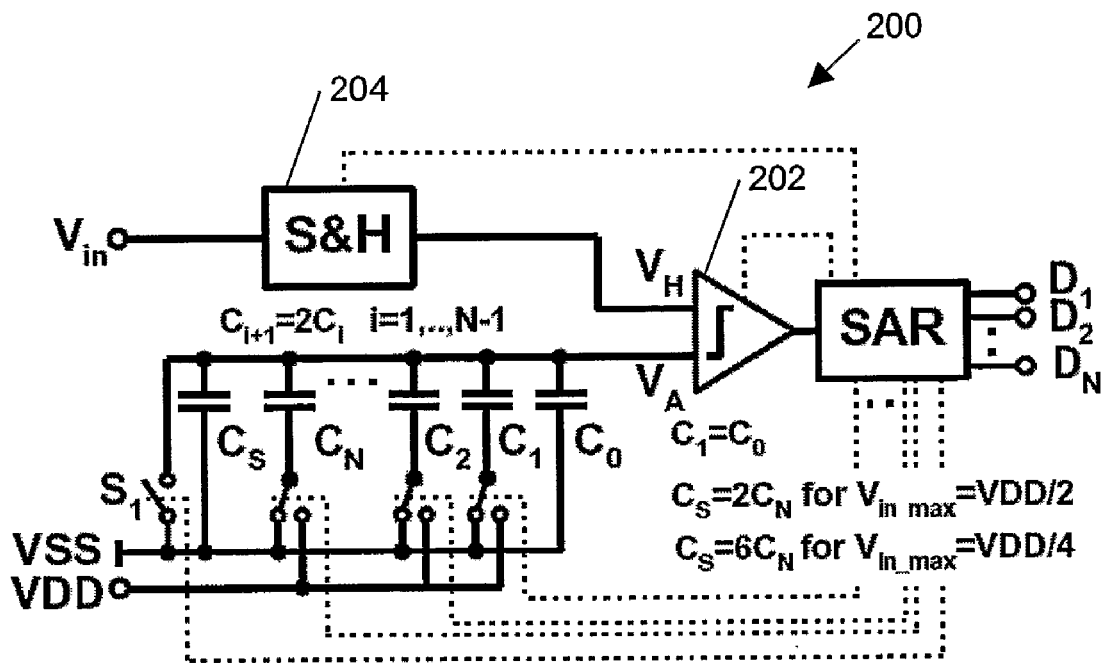
FIG. 2 shows a schematic drawing of a conventional ADC where the input is directly feed to the comparator.
Figure 3:
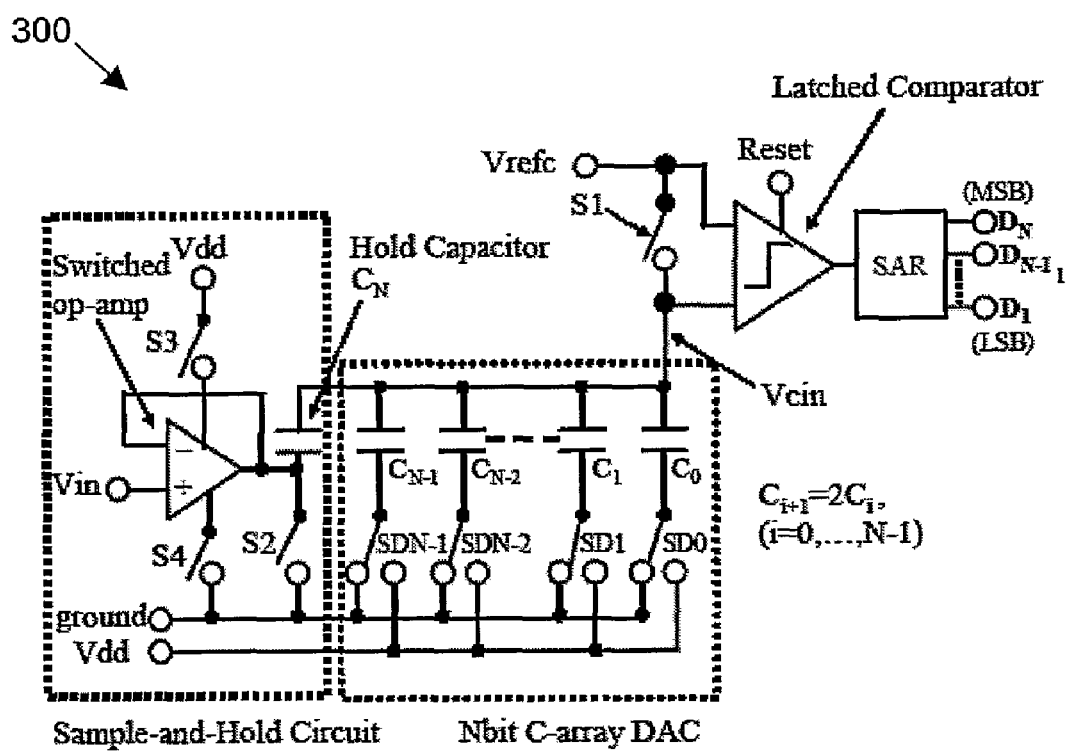
FIG. 3 shows a schematic drawing of a conventional ADC where rail-rail input range is achieved by scaling down the input signal prior to conversion.
Figure 4:
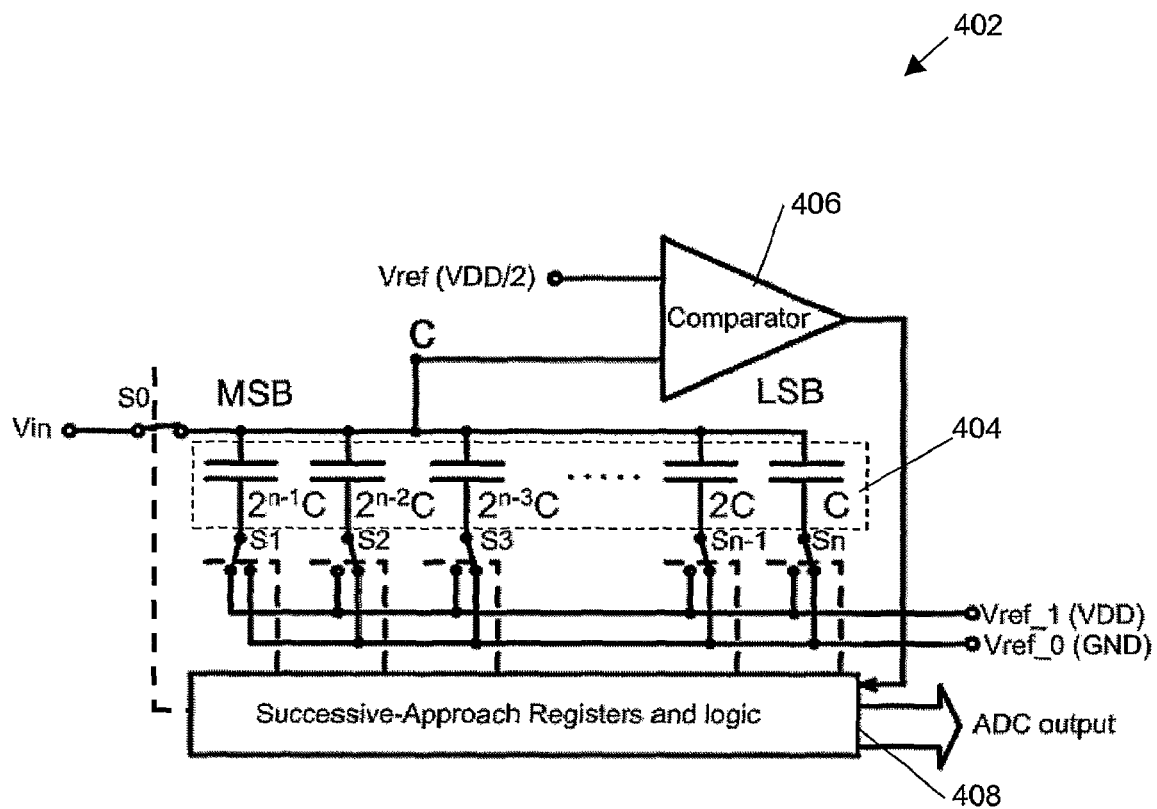
FIG. 4 shows a schematic drawing of a modified n-bit successive approximation ADC according to an embodiment.

FIG. 4 shows a schematic diagram of a modified n-bit successive approximation ADC 402. The actual value of n is arbitrary in practice and can be selected as desired. The ADC 402 comprises a binary-weighted capacitor array 404 and a plurality of switches $S_1$-$S_n$. In this implementation, CMOS switches are used. Each switch $S_1$-$S_n$ is connected in series with one corresponding capacitor and is only required to pass supply rail levels. The inventors have recognised that by modifying the topology of successive approximation ADC based on charge redistribution, the ADC 402 is able to achieve a rail-rail input range when the comparator common-mode input range encompasses the middle level between supply rails, i.e. includes $V_{DD}/2$, when operating at low supply voltages.

The ADC 402 further comprises a comparator 406. A dynamic comparator 406 that does not consume any power when inactive is used to reduce power consumption. The comparator 406 is coupled to the capacitor array 404 of the ADC 402 at one end and has a reference voltage ($V_{ref}$) of $V_{DD}/2$ at the other end. The reason the value $V_{DD}/2$ is chosen as the reference voltage in the described implementation is that it gives the most significant bit (MSB) value, assuming that the full voltage range of $V_{in}$ is $V_{DD}$. The ADC 402 also comprises a successive approximation register (SAR) 408. The SAR 408 controls both an input switch $S_0$, as well as the switches $S_1$-$S_n$ of the ADC 402.

The ADC 402 starts the A/D conversion from the most significant bit (MSB) to the least significant bit (LSB). The MSB corresponds to the capacitor $2^{n-1}C$ and the LSB corresponds to the capacitor C. As such, the A/D conversion begins with the switch $S_1$, corresponding to the capacitor $2^{n-1}C$, being switched to Vref_1 ($V_{DD}$) while the remaining switches $S_2$-$S_n$ are switched to Vref_0 (GND).

Prior to analog-to-digital (A/D) conversion, the input switch $S_0$ of the ADC 402 is switched on, the switch $S_1$ is switched to Vref_1 ($V_{DD}$) and the switches $S_2$-$S_n$ are switched to Vref_0 (GND). The voltage on node C is charged to $V_{in}$. At the beginning of the A/D conversion, the input switch $S_0$ of the ADC 402 is turned off. The voltage $V_{in}$ is held constant on the capacitor array 404 of the ADC 402 and A/D conversion is performed.

The comparator 406 then determines if the voltage at node C is greater than Vref ($V_{DD}/2$). If the voltage at node C is greater than Vref ($V_{DD}/2$), the SAR switches the switch $S_1$ to Vref_0 (GND). Otherwise, the switch $S_1$ remains unchanged. With such an arrangement, if $V_{in} > V_{DD}/2$, by switching the switch $S_1$ back to Vref_0 (GND), the voltage at node C is reduced to about $V_{in} - V_{DD}/2$, or is reduced to within a range of about 0 to about $V_{DD}/2$. After this, the switch $S_2$ is switched to Vref_1 ($V_{DD}$), which is equivalent to adding about $V_{DD}/4$ to the voltage at node C. The comparator 406 determines if the voltage on C is greater than Vref ($V_{DD}/2$). If the voltage at node C is greater than Vref ($V_{DD}/2$), the switch $S_2$ is switched to Vref_0 (GND) and the switch $S_3$ is switched to Vref_1 ($V_{DD}$), which is equivalent to adding about $V_{DD}/8$ to the voltage at node C. Otherwise, the switch $S_2$ remains at Vref_1 ($V_{DD}$). The final states of the switches $S_3$-$S_n$ are determined in the same way as the switches $S_1$ and $S_2$. During the A/D conversion, the voltage at node C successively approaches Vref ($V_{DD}/2$). After the final states of all the switches are determined, the A/D conversion is completed. The SAR 408 resets all the switches $S_1$-Sn to their original states prior to conversion and the input switch $S_0$ is switched on to charge node C to a new input voltage before performing the next A/D conversion.

From the above description, it will be appreciated by a person skilled in the art that $V_{in}$ is scaled down by switching the MSB capacitor $2^{n-1}C$ to Vref_0 (GND) during the A/D conversion when $V_{in} > V_{DD}/2$. This is advantageously achieved without having to use an extra capacitor in addition to the capacitor array 404.

To conserve power, the ADC 402 does not have a dedicated sample-and-hold (S/H) circuit. The S/H function is activated by switching on the input switch $S_0$ prior to the A/D conversion and switching off the input switch $S_0$ at the beginning of the A/D conversion. In this example, the input switch $S_0$ is implemented as a sampling switch. A person skilled in the art will appreciate that the sampling switch may e.g. comprise an n- and p-transistor pair to accommodate the assumed full input voltage range of $V_{DD}$. Alternatively, the switch $S_0$ may represent an implementation of the switching function realized in a pseudo S/H circuit that is described in the following.

Figure 5:
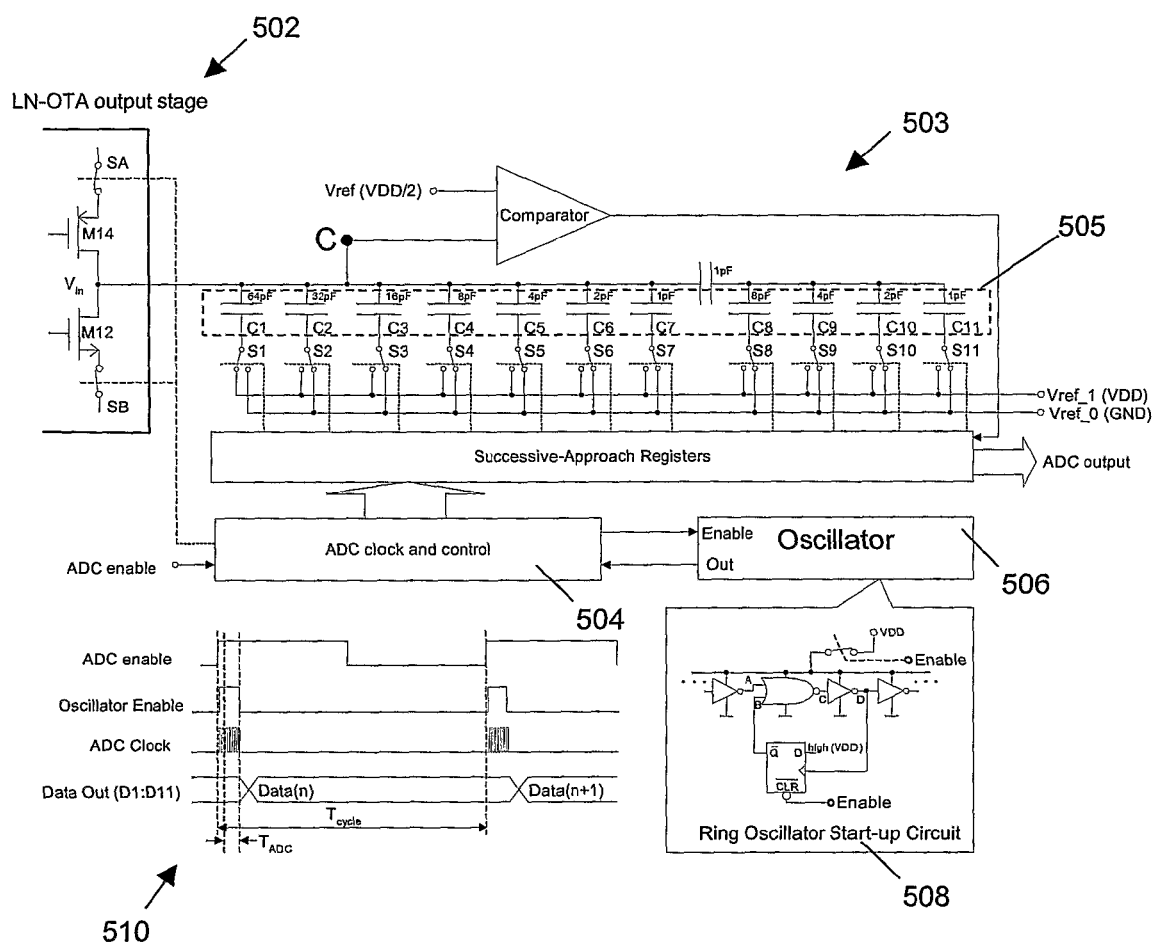
FIG. 5 shows a schematic diagram of a pseudo sample-and-hold circuit coupled to an ADC, according to an embodiment.

FIG. 5 shows a schematic diagram of a pseudo S/H circuit coupled to an ADC 503. The S/H function is performed through an output stage 502 of a low noise operational transconductance amplifier (LN-OTA), which can be considered as a pseudo S/H circuit. The output stage 502 of the LN-OTA is directly connected to the capacitor array 505 of the ADC 503. In this implementation, the function of the input switch $S_0$ is provided by the two switches, SA and SB added in the output stage 502 of the LN-OTA to periodically switch off the output stage 502 of the LN-OTA for a short duration during A/D conversion. The two switches, SA and SB are controlled by an ADC clock and control circuit 504. The ADC clock and control circuit 504 is coupled to a ring oscillator 506. A start-up circuit 508 of the ring oscillator 506 is also shown in FIG. 5. Inlet 510 shows control and output signals for the ADC 503 in the example implementation.

A person skilled in the art will appreciate that other S/H circuits can be used that operate at low rail-rail voltage. Using a pseudo S/H circuit advantageously provides sample-and-hold function without any extra power consumption and chip area. It will be appreciated by the person skilled in the art that the pseudo S/H circuit is suitable for applications where the requirement of data rate is much low than the sampling clock rate of the ADC, but has a stringent power consumption budget, such as surface biopotential measurement and various temperature and pressure sensors etc.

Figure 6:
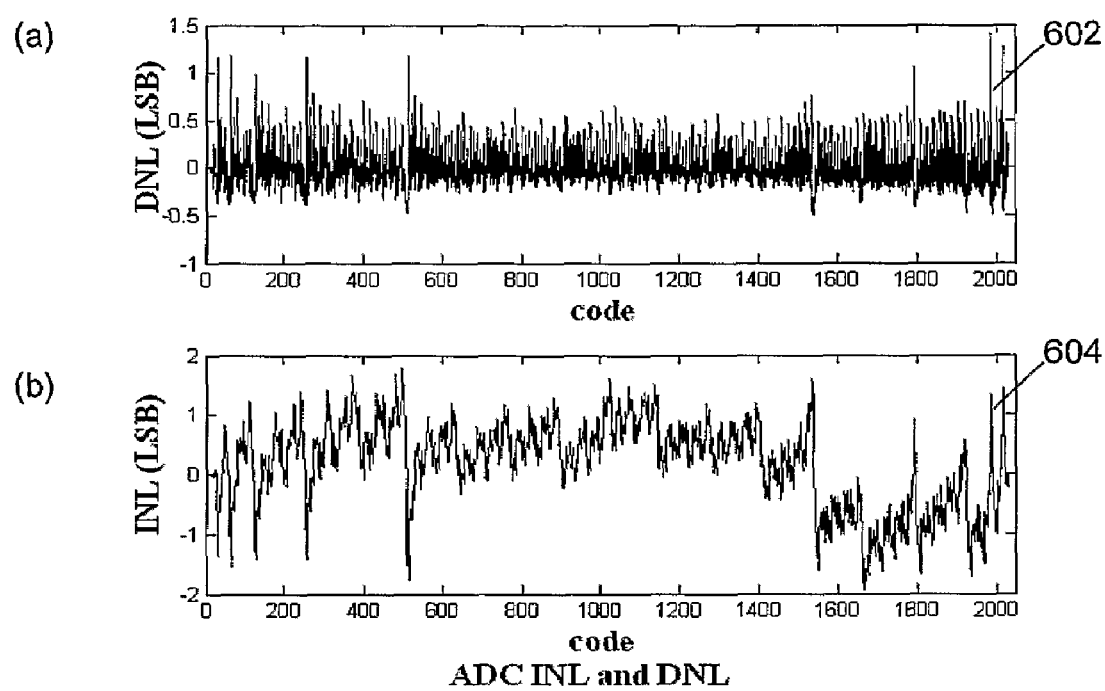
FIG. 6a shows a plot of differential non-linearity versus code width.
FIG. 6b shows a plot of integral non-linearity versus code width.

Confidential experimental results show that the ADC 503 can obtain rail-rail input with a power supply of about 0.8V. The two accuracy parameters for ADCs are differential non-linearity (DNL) and integral non-linearity (INL). FIGS. 6a and 6b show the plots of differential non-linearity (DNL) versus code width and integral non-linearity (INL) versus code width respectively. From FIG. 6a, plot 602 shows that the measured DNL is about 1.5 LSB. From FIG. 6b, plot 604 shows that the measured INL is about ±2 LSB.

As appreciated by a person skilled in the art, the purpose of the pseudo sample-and-hold circuit invention is to switch off the output stage 502 of the LN-OTA only for a very brief time so that the effect of switching can be ignored. This is practicable in many applications, e.g. for low data rate processing in most medical devices, such as electroencephalograms (EEG) and electrocardiograms (ECG), in which the data rate is usually less than 1 kS/s. The conversion time for the ADC 503 can be made very short compared with the data period. To achieve this, the ADC 503 can have a sampling rate of about 500 kS/s and is able to complete an A/D conversion in about 2 μs. Thus, the ADC 503 is idle for most of the time. When the ADC 503 is idle, the switches SA and SB are turned on, and the LN-OTA is in normal operation mode.

Figure 7:
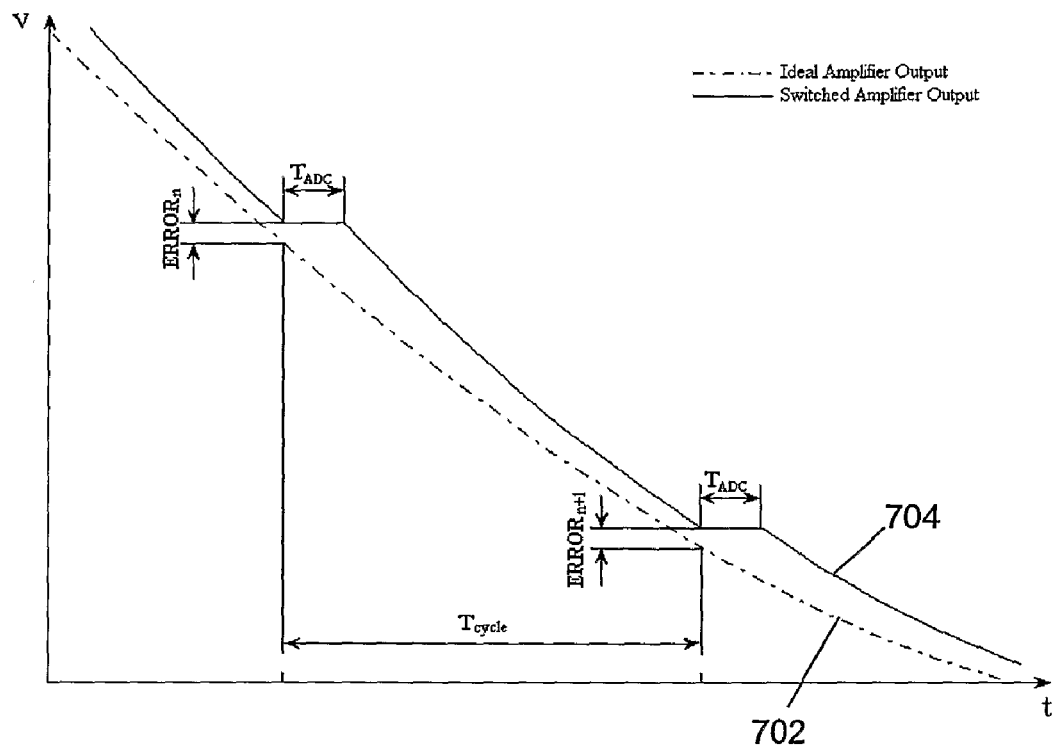
FIG. 7 shows a plot of voltage versus time, illustrating the error caused by switching.

Periodically switching off the output stage 502 of the LN-OTA will introduce some error. FIG. 7 shows a plot of voltage (V) versus time (t), illustrating the error caused by switching. Graph 702 shows a plot of voltage versus time for an ideal amplifier output. Graph 704 shows a plot of voltage versus time for a switched amplifier output.

A first-order analysis shows that the error can be expressed as $$error_n = \sum_{i=-\infty}^{n-1} -\left(\frac{\partial V_{out,ideal}}{\partial t}\right)_i \cdot T_{ADC} \cdot e^{-[(n-i)T_{cycle}-T_{ADC}]/\tau} \quad (1)$$

where $V_{out,ideal}$ is the ideal output with no switching, $\tau$ is a constant determined by circuit parameters, $T_{ADC}$ is the A/D conversion time and $T_{cycle}$ is the sampling period. Using equation (1), it can be determined whether the error caused by switching is negligible. In practice, the allowable maximum error depends on each particular application, as appreciated by the person skilled in the art.

Assuming that $T_{ADC} \ll T_{cycle}$, ($T_{cycle}$ can be considered as the reciprocal of the data rate) the worst case tracking error is $$|error|_{max} = \left|\frac{\partial V_{out,ideal}}{\partial t}\right|_{max} \cdot T_{ADC} \cdot e^{-T_{cycle}/\tau} / \left(1 - e^{-T_{cycle}/\tau}\right) \quad (2)$$

According to equation (2), if $T_{cycle}$ is sufficiently long and $T_{ADC}$ is sufficiently short, the error can be negligible. In an example design, $\tau \approx 850$ μs, $T_{ADC}=2$ μs, $T_{cycle}=1$ ms. For a typical ECG signal, the maximum error is about 0.3 μV, which is well below the input-referred noise of the LN-OTA and can therefore be ignored.

Figure 8:
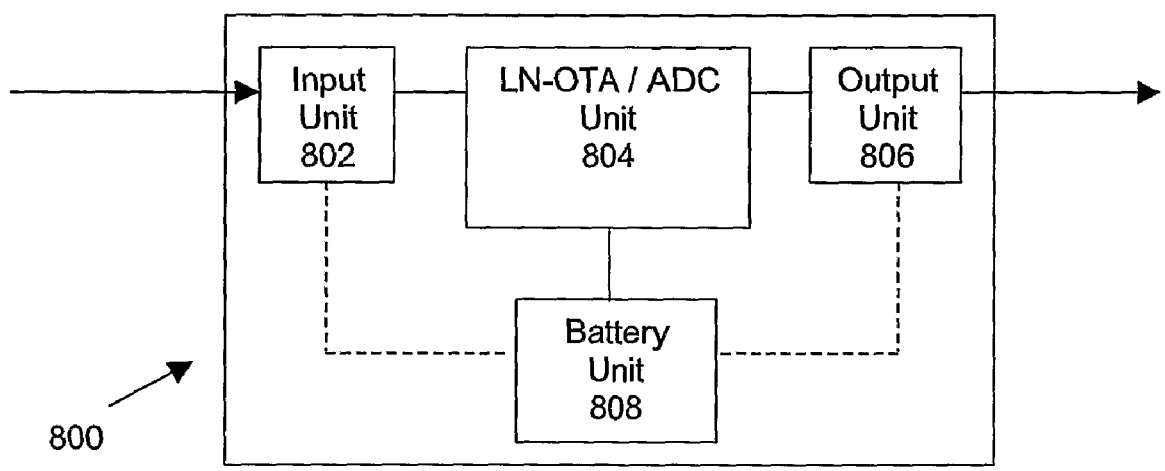
FIG. 8 shows a schematic diagram of a battery operated electronic device.

FIG. 8 shows a schematic diagram of a battery operated electronic device 800 such as a portable medical device for electroencephalogram (EEG) and electrocardiogram (ECG). The device 800 comprises an input unit 802, a LN-OTA/ADC unit 804, an output unit 806 and a battery unit 808. The LN-OTA/ADC unit 804 is coupled to the input unit 802 and the output unit 806. The battery unit is coupled to the LN-OTA/ADC unit 804. The battery unit can also be coupled to active components of the input unit 802 and the output unit 806.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

The invention claimed is:

1. An analog-to-digital converter (ADC) comprising:
an input switch;
an array of binary-weighted capacitors configured to receive an input voltage signal via the input switch in an on-state of the input switch;
a plurality of switches coupled in series with respective ones of the capacitors at an opposite side of the respective capacitor compared to the input switch, wherein the switches are configured to have respective first switching states in which the switches are coupled to a reference voltage ($V_{DD}$) and at least respective second switching states in which the switches are coupled to ground;
a comparator having a first input configured to receive a voltage from the input switch side of the array of capacitors and a second input configured to receive a voltage signal about half of the reference voltage ($V_{DD}/2$); and
a successive approximation register (SAR) coupled to an output of the comparator and configured to control the input switch and the plurality of switches based at least in part on the output from the comparator;
wherein the input switch is configured to be in the on-state longer than an amount of time the input switch is in an off-state to reduce an error rate of an analog-to-digital conversion of the input voltage signal.

2. The ADC as claimed in claim 1, wherein the input switch is configured to be in the on-state prior to analog-to-digital conversion to provide the input voltage to the array of binary-weighted capacitors and is configured to be in an off-state during the analog-to-digital conversion.

3. The ADC as claimed in claim 1, wherein the input switch is implemented as a sampling switch.

4. The ADC as claimed in claim 3, wherein the sampling switch comprises an n- and p-transistor pair.

5. The ADC as claimed in claim 1, wherein the input switch is implemented in an output stage of a Low Noise Operational Transconductance Amplifier (LN-OTA) coupled to the ADC.

6. The ADC as claimed in claim 5, wherein the input switch is implemented by a pair of switch elements in the output stage of the LN-OTA coupled to the ADC.

7. The ADC as claimed in claim 1, wherein a first switch among the plurality of switches is coupled to a capacitor that corresponds to a most significant bit (MSB) in a digital output of the ADC, and wherein the SAR is configured to couple the first switch coupled to the MSB capacitor to $V_{DD}$ and to couple other switches among the plurality of switches to ground, prior to the analog-to-digital conversion of the input voltage signal.

8. The ADC as claimed in claim 7, wherein, at the beginning of the analog-to-digital conversion, the first switch coupled to the MSB capacitor is configured to be coupled to the $V_{DD}$, and the other switches among the plurality of switches are configured to be coupled to ground.

9. The ADC as claimed in claim 8, wherein the first switch coupled to the MSB capacitor is configured to be coupled to ground for subtracting about $V_{DD}/2$ from the input voltage in response to the comparator determining that the voltage from the input switch side of the array of capacitors is greater than $V_{DD}/2$, and is configured to remain coupled to $V_{DD}$ in response to the voltage from the input switch side of the array of capacitors being lower than or equal to $V_{DD}/2$.

10. The ADC as claimed in claim 9, wherein the first switch coupled to the MSB capacitor is configured to be coupled to ground for subtracting about $V_{DD}/2$ from the input voltage, such that the voltage at the input switch side of the array of capacitors is reduced to within a range from about 0 volts to about $V_{DD}/2$ volts.

11. The ADC as claimed in claim 9, wherein, in a register sequence, a second switch among the plurality of switches coupled to a next lower bit capacitor is then configured to be switched to the $V_{DD}$ and said second switch is configured to be switched to ground in response to the comparator determining that the voltage from the input switch side of the array of capacitors is greater than $V_{DD}/2$, and is configured to remain coupled to $V_{DD}$ in response to the voltage from the input switch side of the array of capacitors being lower than or equal to $V_{DD}/2$.

12. The ADC as claimed in claim 11, wherein said register sequence is configured to be sequentially applied to all switches among the plurality of switches, from the first switch coupled to the MSB capacitor to a third switch coupled to a capacitor corresponding to a least significant bit (LSB).

13. The ADC as claimed in claim 12, wherein the input switch is configured to be closed to provide a new input signal to the array of capacitors after the third switch coupled to the LSB capacitor has been subjected to the register sequence.

14. A battery operated electronic device comprising an analog-to-digital converter (ADC),
wherein the ADC includes
an input switch;
an array of binary-weighted capacitors configured to receive an input voltage signal via the input switch in an on-state of the input switch;
a plurality of switches coupled in series with respective ones of the capacitors at an opposite side of the respective capacitor compared to the input switch, wherein the switches are configured to have respective first switching states in which the switches are coupled to a reference voltage ($V_{DD}$) and at least respective second switching states in which the switches are coupled to ground;
a comparator having a first input configured to receive a voltage from the input switch side of the array of capacitors and a second input configured to receive a voltage signal about half of the reference voltage ($V_{DD}/2$); and
a successive approximation register (SAR) coupled to an output of the comparator and configured to control the input switch and the plurality of switches based at least in part on the output from the comparator;
wherein the input switch is configured to be in the on-state longer than the input switch is configured to be in an off-state to reduce an error rate of an analog-to-digital conversion of the input voltage signal.

15. The battery operated electronic device as claimed in claim 14, wherein the device is a medical device for electroencephalograms (EEG) or electrocardiograms (ECG).

16. The battery operated electronic device as claimed in claim 14, further comprising:
an input unit coupled to the ADC;
an output unit coupled to the ADC; and
a battery unit coupled to the ADC, the input unit and the output unit.

17. The battery operated electronic device as claimed in claim 14, wherein the input switch of the ADC is implemented by a pair of switch elements in an output stage of a Low Noise Operational Transconductance Amplifier (LN-OTA).

18. The battery operated electronic device as claimed in claim 17, further comprising an ADC clock and control circuit coupled to the pair of switch elements configured to periodically switch off the output stage of the LN-OTA during the analog-to-digital conversion.

19. The battery operated electronic device as claimed in claim 18, further comprising a ring oscillator coupled to the ADC clock and control circuit.

20. The battery operated electronic device as claimed in claim 14, wherein the analog-to-digital conversion takes about 2 microseconds (μs) and the device has a data rate of less than 1 kilosamples per second (kS/s).

21. The battery operated electronic device as claimed in claim 14, wherein the $V_{DD}$ is about 0.8 volts.

22. The battery operated electronic device as claimed in claim 14, wherein the error rate is estimated based on an amount of time associated with the analog-to-digital conversion and a data rate of the input voltage signal.

23. The battery operated electronic device as claimed in claim 14, wherein the input switch of the ADC is implemented by a pair of switch elements in an output stage of a Low Noise Operational Transconductance Amplifier (LN-OTA), and wherein a worst case error rate of the ADC is estimated based on the following equation:

$$|error|_{max} = \left| \frac{\partial V_{out,ideal}}{\partial t} \right|_{max} \cdot T_{ADC} \cdot e^{-T_{cycle}/\tau} / \left(1 - e^{-T_{cycle}/\tau}\right)$$

wherein
$V_{out,ideal}$ is an ideal output of the LN-OTA without switching the input switch,
$\tau$ is a constant determined by circuit parameters of the electronic device,
$T_{ADC}$ is the amount of time associated with the analog-to-digital conversion, and
$T_{cycle}$ is reciprocal of the data rate of the input voltage signal.

24. The battery operated electronic device as claimed in claim 14, wherein a first switch among the plurality of switches of the ADC is coupled to a capacitor among the array of binary-weighted capacitors of the ADC that corresponds to a most significant bit (MSB) in a digital output of the ADC, and wherein the SAR of the ADC is configured to couple the first switch coupled to the MSB capacitor to $V_{DD}$ and to couple the other switches among the plurality of switches to ground, prior to the analog-to-digital conversion of the input voltage signal.

25. A method of analog-to-digital conversion comprising:
receiving, by an array of binary-weighted capacitors, an input voltage signal via an input switch in an on-state of the input switch, wherein the array of capacitors are coupled in series with respective ones of a plurality of switches at an opposite side of the respective capacitor compared to the input switch, wherein the respective ones of the plurality of switches are configured to have respective first switching states in which the switches are coupled to a reference voltage ($V_{DD}$) and at least respective second switching states in which the switches are coupled to ground;
receiving, by a comparator coupled to a successive approximation register (SAR), a first voltage input from the input switch side of the array of capacitors and a second input equals to a voltage of about half of a reference voltage ($V_{DD}/2$);
comparing, by the comparator, the first voltage input and the second voltage input;
converting the input voltage signal to a digital signal at least partially based on said comparing; and
maintaining the input switch in the on-state longer than an amount of time the input switch is in an off-state to reduce an error rate of an analog-to-digital conversion of the input voltage signal.

26. The method of claim 25, further comprising:
switching the input switch to an off-state prior to the analog-digital conversion of the input voltage signal.

27. The method as claimed in claim 25, further comprising switching, by the SAR, a first switch coupled to a first capacitor among the array of capacitors to $V_{DD}$, wherein the first capacitor corresponds to a most significant bit (MSB) in a digital output of the analog-to-digital conversion, and other switches among the plurality of switches coupled to capacitors corresponding to lower bit values to ground prior to the analog-to-digital conversion of the input voltage signal.

28. The method of claim 27, further comprising:
switching the first switch among the plurality of switches coupled to the MSB capacitor to ground in response to the comparator determining that the voltage from the input switch side of the array of capacitors is greater than $V_{DD}/2$, or maintaining the first switch coupled to $V_{DD}$ in response to the voltage from the input switch side of the array of capacitors being lower than or equal to $V_{DD}/2$.

29. The method of claim 27, further comprising performing a register sequence that comprises:
switching a second switch among the plurality of switches that is coupled to a next lower bit capacitor to $V_{DD}$;
comparing the voltage from the input switch side of array of capacitors to $V_{DD}/2$; and
switching the second switch to ground in response to the comparator determining the voltage from the input switch side of the array of capacitors is greater than $V_{DD}/2$, or maintaining the second switch coupled to $V_{DD}$ in response to the voltage from the input switch side of the array of capacitors being lower than or equal to $V_{DD}/2$.

30. The method of claim 29, further comprising:
repeating the register sequence for all switches among the plurality of switches coupled to the array of capacitors, from the first switch among the plurality of switches that is coupled to the MSB capacitor to a switch among the plurality of switches that is coupled to a capacitor corresponding to a least significant bit (LSB).

31. The method of claim 25, further comprising:
switching the input switch to the on-state to sample a new input voltage signal after the analog-to-digital conversion of the input voltage signal is finished.

32. A analog-to-digital converter ADC, comprising:
means including an array of binary-weighted capacitors, for receiving an input voltage signal via an input switch in an on-state of the input switch, the array of capacitors coupled in series with respective ones of a plurality of switches at an opposite side of the respective capacitor compared to the input switch;
means for receiving a first voltage input from the input switch side of the array of capacitors and a second input equals to a voltage signal about half of a reference voltage ($V_{DD}$);
means for comparing the first voltage input and the second voltage input;
means for converting the input voltage signal to a digital signal at least partially based at least in part on the comparing; and
means for maintaining the input switch in the on-state longer than an amount of time the input switch is in on off-state to reduce an error rate of the analog-to-digital conversion.

* * * * *